United States Patent
Schmidt

(10) Patent No.: US 8,630,818 B2
(45) Date of Patent: Jan. 14, 2014

(54) METHOD AND DEVICE FOR THE DETERMINATION OF A STATISTICAL MEASUREMENT VALUE

(75) Inventor: Kurt Schmidt, Grafing (DE)

(73) Assignee: Rohde & Schwarz GmgH & Co. KG, Munich (DE)

( * ) Notice: Subject to any disclaimer, the term of this patent is extended or adjusted under 35 U.S.C. 154(b) by 462 days.

(21) Appl. No.: 12/516,672
(22) PCT Filed: Oct. 25, 2007
(86) PCT No.: PCT/EP2007/009282
§ 371 (c)(1),
(2), (4) Date: Jun. 1, 2009
(87) PCT Pub. No.: WO2008/064752
PCT Pub. Date: Jun. 5, 2008

(65) Prior Publication Data
US 2010/0030517 A1    Feb. 4, 2010

(30) Foreign Application Priority Data
Nov. 28, 2006 (DE) .......................... 10 2006 056 154

(51) Int. Cl.
*G01R 23/18*    (2006.01)
(52) U.S. Cl.
USPC .......................................... 702/179; 702/180
(58) Field of Classification Search
USPC ................................................. 702/179, 180
See application file for complete search history.

(56) References Cited

U.S. PATENT DOCUMENTS

| | | | |
|---|---|---|---|
| 4,885,713 A | 12/1989 | Miller | |
| 5,003,248 A * | 3/1991 | Johnson | 324/121 R |
| 5,065,147 A | 11/1991 | Rice et al. | |
| 5,103,402 A * | 4/1992 | Morton et al. | 702/76 |
| 5,241,302 A | 8/1993 | Thong | |

(Continued)

FOREIGN PATENT DOCUMENTS

| | | |
|---|---|---|
| DE | 3880362 T2 | 11/1993 |
| DE | 69009588 T2 | 10/1994 |

(Continued)

OTHER PUBLICATIONS

Kumari L. Fernando et al., "Mean Frequency Estimation of Narrowband Signals", IEEE Signal Processing Letters, vol. 11, No. 2, Feb. 2004, pp. 175-178.*

(Continued)

*Primary Examiner* — Michael Nghiem
*Assistant Examiner* — Alexander Satanovsky
(74) *Attorney, Agent, or Firm* — Ditthavong Mori & Steiner, P.C.

(57) ABSTRACT

A method and a device for determining a statistical parameter for all frequencies of a frequency distribution of signal levels of a test signal registered respectively in several observation intervals counts the frequency of the signal level of the test signal measured in each case within the respective signal-level range and at the respective value of the time or frequency raster of the frequency distribution from new within every observation interval, and buffers it for display on a display device. After every observation interval, for every signal-level range and every value of the time or frequency raster of the frequency distribution, the respective statistical parameter from the respective, newly-buffered frequency and all respective frequencies measured and buffered at earlier observation intervals is determined and buffered.

5 Claims, 6 Drawing Sheets

(56) References Cited

U.S. PATENT DOCUMENTS

| | | | |
|---|---|---|---|
| 5,587,898 A * | 12/1996 | Palm | 700/50 |
| 5,684,507 A | 11/1997 | Rasnake et al. | |
| 5,742,819 A * | 4/1998 | Caccavale | 1/1 |
| 6,591,682 B1 * | 7/2003 | Lysen | 73/602 |
| 7,092,853 B2 * | 8/2006 | Collier et al. | 702/195 |
| 7,219,034 B2 * | 5/2007 | McGee et al. | 702/180 |
| 7,873,486 B2 * | 1/2011 | Earls | 702/76 |
| 2006/0025947 A1 | 2/2006 | Earls | |

FOREIGN PATENT DOCUMENTS

| | | |
|---|---|---|
| DE | 19545776 A1 | 6/1996 |
| DE | 69523843 T2 | 6/2002 |
| DE | 102006005595 A1 | 9/2007 |
| EP | 0822416 A2 | 2/1998 |
| GB | 2207517 A | 2/1989 |
| GB | 2214764 A | 9/1989 |
| WO | 9744677 A1 | 11/1997 |
| WO | 2007056677 A2 | 5/2007 |

OTHER PUBLICATIONS

SR785 Dynamic Signal Analyzer, Stanford Research Systems, Inc., 1290-D Reamwood Ave., Sunnyvale, CA 94089; http://www.thinksrs.com/downloads/PDFs/Catalog/SR785c.pdf.*

Arnold P.G. Peterson, "Handbook of Noise Measurements", Ninth Edition, Concord, Massachusetts, 1980, 394 pp.*

"DPOs Deliver More Signal Information for Faster Design and Troubleshooting Answers", Application Note, Tektronix, Updated May 12, 2006, pp. 1-12, http://tek.essa.es/files/pdf/pdf-109.pdf.*

Product Data. Modular Precision Sound Analyzer—2260 Investigator™, Brüel & Kjær, Oct. 2006, 12 pp.—http://www.livingston-products.com/products/pdf/105227_1_en.pdf.*

"Glossary/Explanation of Terms", 2011 Casella CEL Inc., p. 1-3, http://www.casellausa.com/store/page.cfm?pageID=7854444548.*

International Search Report, WO 2008/064752 A1, Mar. 14, 2008, pp. 24-29.

International Preliminary Report on Patentability, PCT/EP2007/009282, dated Jul. 16, 2009, pp. 1-15.

* cited by examiner

METHOD AND DEVICE FOR THE DETERMINATION OF A STATISTICAL MEASUREMENT VALUE

CROSS-REFERENCE TO RELATED APPLICATION

The present application is a national phase application of PCT Application No. PCT/EP2007/009282, filed on Oct. 25, 2007, and claims priority to German Application No. 10 2006 056 154.6, filed on Nov. 28, 2006, the entire contents of which are herein incorporated by reference.

BACKGROUND OF THE INVENTION

1. Field of the Invention

The invention relates to a method and a device for determining a statistical measurement parameter for all frequencies of a frequency distribution of signal levels of a test signal registered respectively in several observation intervals.

2. Discussion of the Background

Measuring devices and systems often offer the presentation of signal-level distributions of a signal to be measured against frequency or against time. For this purpose, within a given time raster, it is determined whether in each case a signal level of the signal to be measured is present within the respective signal-level range and at the respective value of the time or frequency raster. In the presence of a signal level of the test signal, a counter associated with the respective signal-level range and the respective value of the time or frequency raster is incremented. At the end of the observation interval, the counter statuses of all counters are read out and supplied to the display device to update the display.

A presentation of this kind is required, for example, for real-time spectrum analyzers, as known, for example from U.S. Pat. No. 5,103,402.

The continuous updating of the display device with the current frequency distribution of the registered signal level of the test signal against time or frequency allows only the presentation of the current frequency distribution—short-term behavior—of the generally stochastic test signal. This is shown in FIGS. 1, 2 and 3 of the drawings, which each present the spectral distribution of a measured signal at different timing points, wherein the frequency of the registered, frequency-dependent signal levels of the test signal corresponds to a specific color or, with regard to FIGS. 1, 2 and 3, to a specific level of grey. FIG. 1 shows the spectral distribution of a band-pass signal in a constantly-active main channel. In FIGS. 2 and 3, in addition to the spectral distribution of the band-pass signal in the constantly-active main channel, the spectral distribution of the band-pass signal is presented respectively in a subsidiary channel active only in the short term. It is evident that the signal information regarding the spectral distribution of the band-pass signal in the subsidiary channel only active in the short-term is presented on the display of the display device only against the time duration of the respectively-active subsidiary channel and is then disadvantageously lost.

Obtaining an item of signal information of the stochastic test signal over a relatively longer time horizon—long-term behavior—wherein signal components active in the short-term are also included and are not lost, cannot be realized with a determination and presentation of the frequency distribution of the signal levels of a test signal of this kind representing the prior art.

SUMMARY OF THE INVENTION

Embodiments of the invention is therefore advantageously provide a method and a device for the determination and presentation of the long-term behavior of the frequency distribution of signal levels of a stochastic test signal against a time or frequency raster taking into consideration signal components active in the short-term.

According to embodiments of the invention, after every observation interval, for every signal-level range and every value of the time or frequency raster of the probability distribution, the respectively-determined frequency of the registered signal level of the test signal with the frequencies of the registered signal levels of the test signal determined respectively in all earlier observation intervals for the same signal-level range and the same value of the time or frequency raster is evaluated in order to determine a statistical parameter for the respective signal-level range and for the respective value of the time or frequency raster of the probability distribution.

The statistical measurement parameter can be, for example, the maximum value, the minimum value, the mean value of the frequencies determined respectively in the individual observation intervals of the frequency distribution or may be other statistical parameters, which characterize the long-term behavior of the frequency of the frequency distribution of the registered signal levels of the test signal associated with the individual signal-level ranges and the individual values of the time or frequency raster.

In the event that, within an observation interval, no frequency value is determined for a signal-level range and for a value of the time or frequency raster of the frequency distribution of the registered signal levels of the test signal, instead of a non-activation of the pixel determined for the respective signal-level range and for the respective value of the time or frequency raster, the value of the statistical parameter currently determined for the respective signal-level range and for the respective value of the time or frequency raster is preferably presented on the display of the display device.

A different brightness is used to distinguish the presentation of a currently-determined statistical value from a currently-determined frequency. Since the respective statistical value is generally determined less frequently than the respective frequency, the statistical value is preferably presented on the display of the display device in a relatively brighter brightness than the respective frequency value.

BRIEF DESCRIPTION OF THE DRAWINGS

An exemplary embodiment of the method according to the invention and the device according to the invention for determining a statistical parameter for all frequencies of a frequency distribution of signal levels of a test signal registered respectively in several observation intervals are explained in greater detail below with reference to the drawings. The drawings are as follows.

DETAILED DESCRIPTION OF EXEMPLARY EMBODIMENTS OF THE INVENTION

Figure 9:
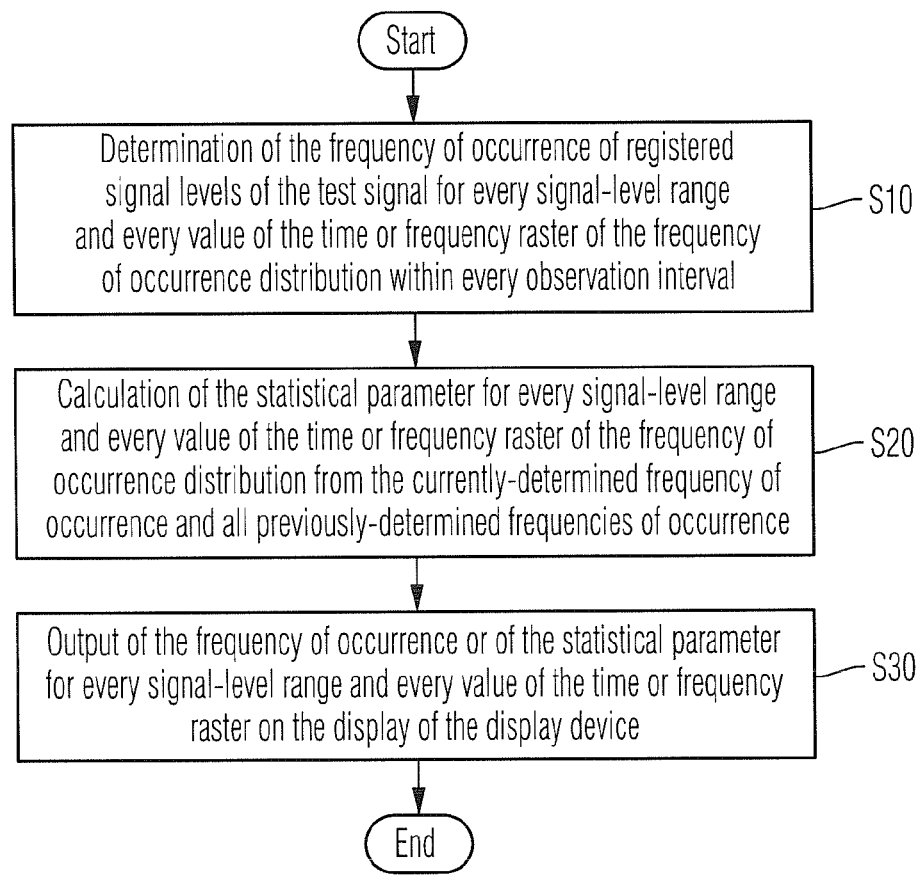
FIG. 9 shows a flow chart for the method according to the invention for determining a statistical parameter for all frequencies of a frequency distribution of signal levels of a test signal registered respectively in several observation intervals.

In the following section, the method according to the invention for determining a statistical parameter for all frequencies of a frequency distribution of signal levels of a test signal registered respectively in several observation intervals is described with reference to FIG. 9.

In a first procedural stage S10, in the cycle of the individual observation intervals, the frequency of the signal level registered within the respective observation interval of the test signal in the individual signal-level ranges and at the individual values of the time or frequency raster of the frequency distribution is counted and buffered in a memory cell of a memory unit 1 associated with the respective signal-level range and with the respective value of the time or frequency raster of the frequency distribution and the respective observation interval.

In the next procedural stage S20, for every signal-level range and every value of the time or frequency raster of the frequency distribution, in each case, in the cycle of the individual observation intervals, a statistical parameter—for example, the maximum value, the minimum value or the mean value—is calculated from the frequency value currently determined and buffered in procedural stage S10 in each case for the respective signal-level range and for the respective value of the time or frequency raster and from all frequency values determined and buffered in earlier observation intervals for the same signal-level range and for the same value of the time or frequency raster and is buffered in a memory cell of the memory unit 1 associated with the respective signal-level range and with the respective value of the time or frequency raster of the frequency distribution.

In the next and final procedural stage S30, at the end of each observation interval, in the case of a frequency of signal levels of the test signal in the respective signal-level range and at the respective value of the time or frequency raster of the frequency distribution determined within the respective observation interval and different from zero, the respective frequency value is presented on the display of the display device 2 with a color or level of grey corresponding to the frequency value.

In the event that, at the end of the respective observation interval, no signal level of the test signal is registered within the respective signal-level range and at the respective value of the time or frequency raster of the frequency distribution, and accordingly, a frequency value of zero is present, the buffered statistical parameter updated at the end of the respective observation interval in accordance with procedural stage S20 is presented on the display in the display device 2 with a color or level of grey corresponding to the value of the statistical parameter instead of the frequency value.

The value of the statistical parameter associated with a signal-level range and with a value of the time or frequency raster of the frequency distribution is presented on the display of the display device 2 until a new frequency value is determined at the same signal-level range and the same value of the time or frequency raster in one of the subsequent observation intervals and the value of the statistical parameter is replaced by the new frequency value.

Figure 1:
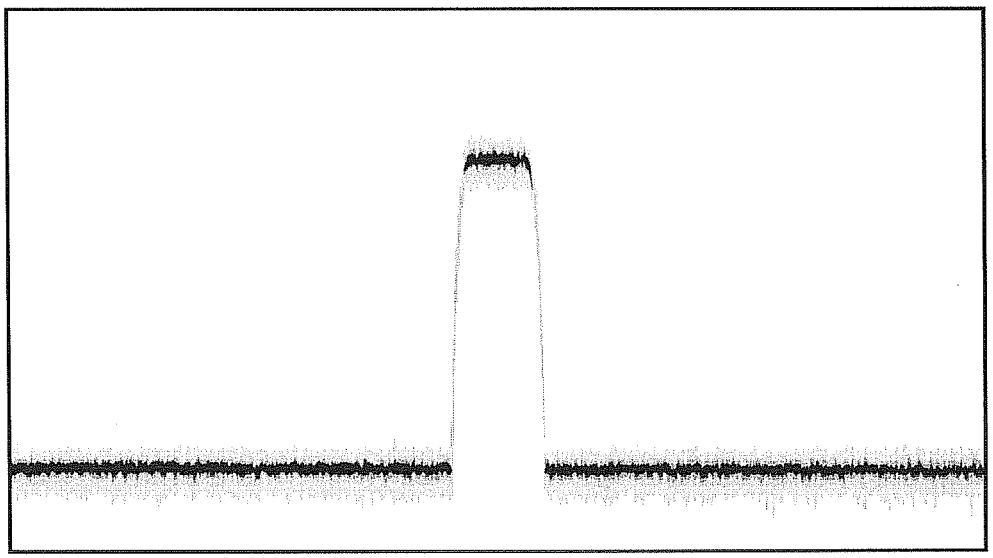
FIG. 1 shows a time or spectral presentation of the frequency of signal levels of a test signal.
Figure 2:
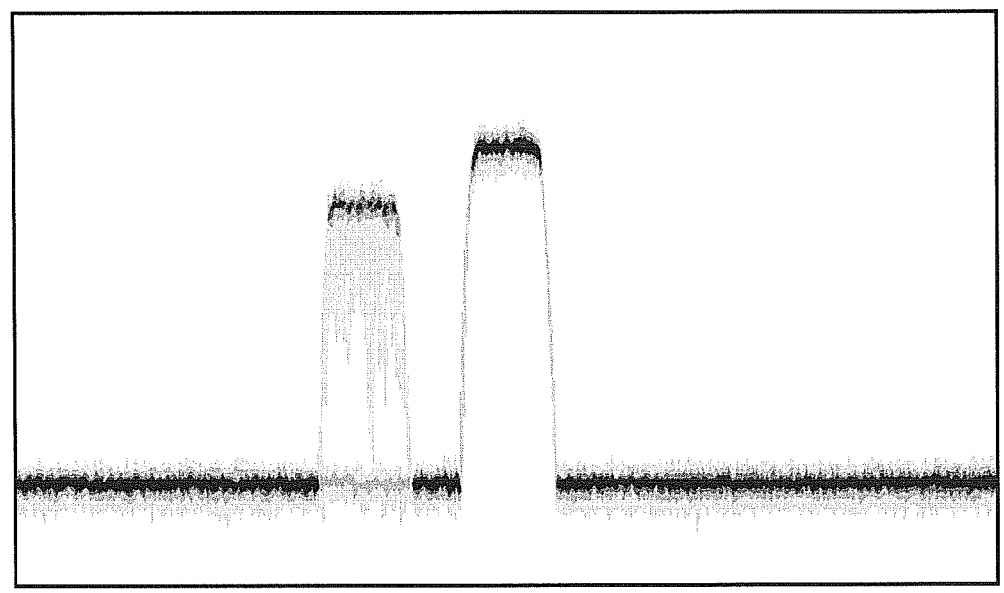
FIG. 2 shows a spectral presentation of the frequency of signal-level values of a first exemplary test signal within the current observation interval.
Figure 3:
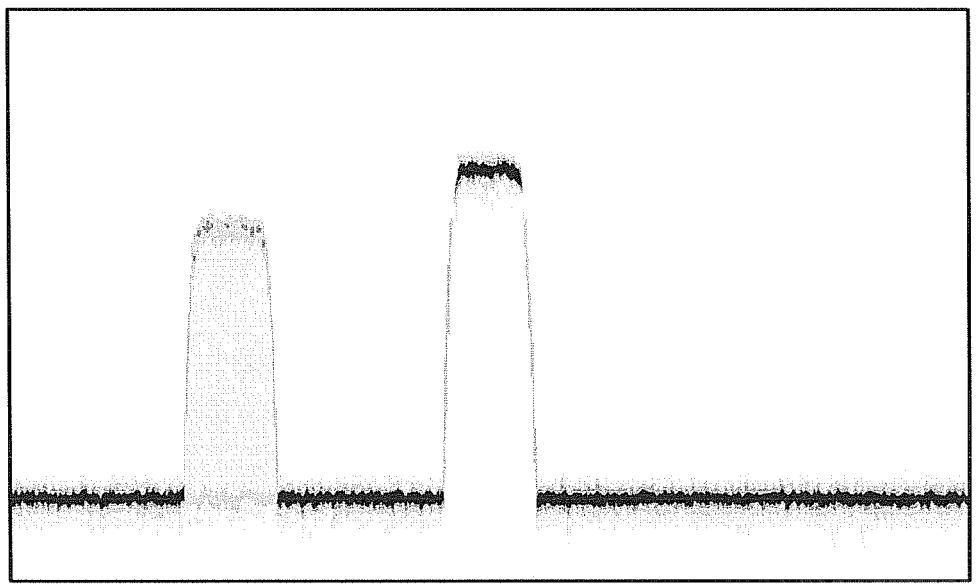
FIG. 3 shows a spectral presentation of the frequency of signal-level values of a first exemplary test signal within the current observation interval.
Figure 8:
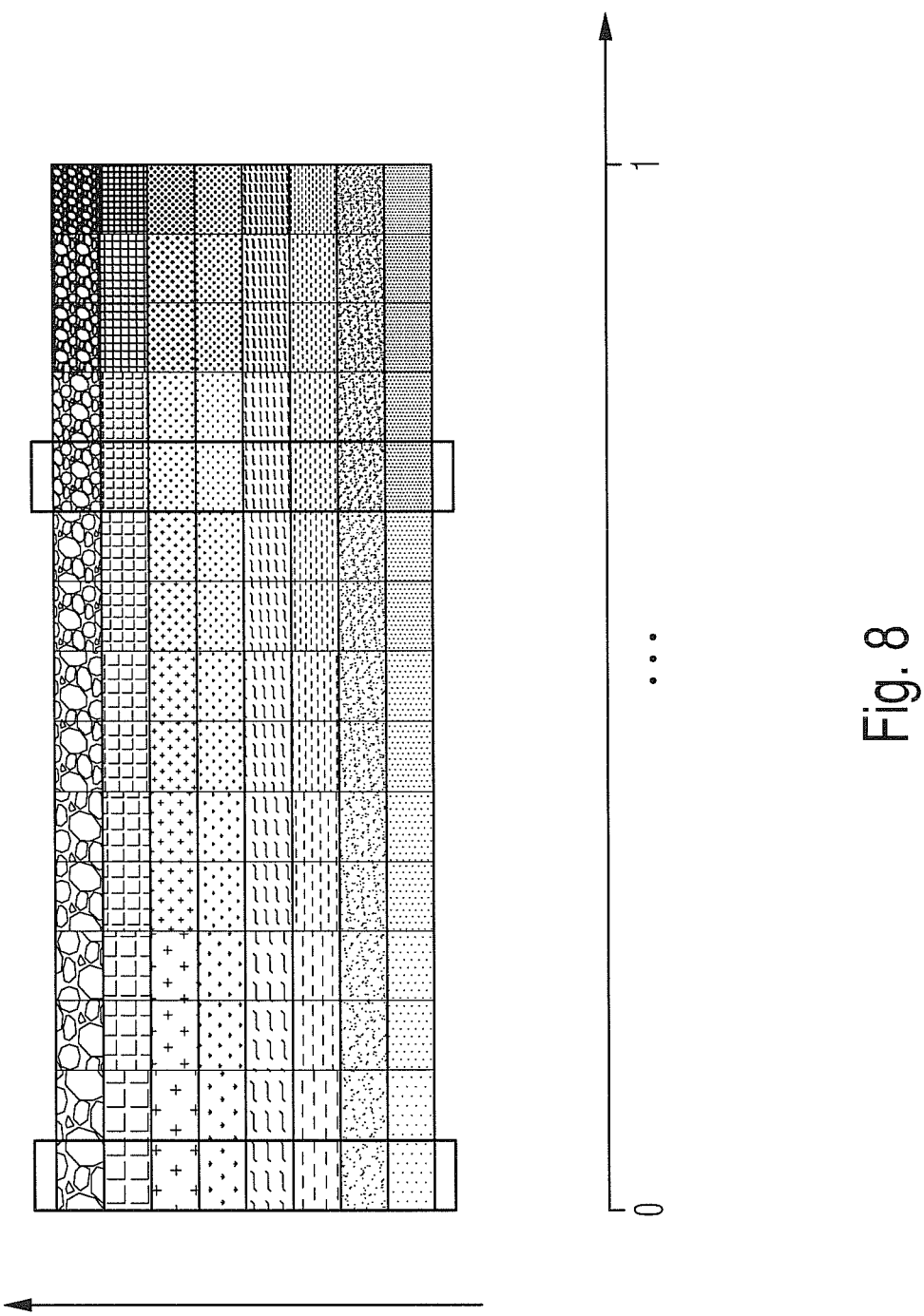
FIG. 8 shows a two-dimensional matrix with different levels of grey and different patterns or colors for the presentation of four-dimensional parameters on a display of a display device.

Since a frequency value and a value of a statistical parameter can be displayed at the same time in the pixels of the display of the display device 2 associated with the individual signal-level ranges and with the individual values of the time or frequency raster of the frequency distribution, the three-dimensional signal presentation of the spectral distribution in FIGS. 1, 2 and 3 must be expanded to a four-dimensional signal presentation in order to distinguish between them. For this purpose, a two-dimensional matrix according to FIG. 8 is used, which provides different levels of grey in the abscissa direction and different patterns in the ordinate direction or, as an alternative to the presentation in FIG. 8, provides different levels of color. In practice, different levels of color will be more suitable than different patterns, but these cannot be presented within the framework of this patent application. For the presentation of the frequency value or of the value of the statistical parameter, a level of color assigned to the frequency value or the value of the statistical parameter or a pattern assigned to the frequency value or to the value of the statistical parameter corresponding to FIG. 8 is used, while for the classification of a frequency value, a darker level of color or a darker level of grey corresponding to the right-hand box of matrix elements arranged vertically in FIG. 8 is used and, for the classification of a statistical parameter, a lighter level of color or a lighter level of grey corresponding to the left-hand box of matrix elements arranged vertically in FIG. 8 is used.

Through the use of different levels of brightness, a prioritisation of the individual display values on the display is realized. The presentation of the statistical parameters only updated comparatively sporadically in a relatively brighter tone pushes the statistical parameters into the background of the display presentation by comparison with the comparatively more-frequently-updated frequency values, of which the frequency values are presented in a relatively darker tone.

Figure 4:
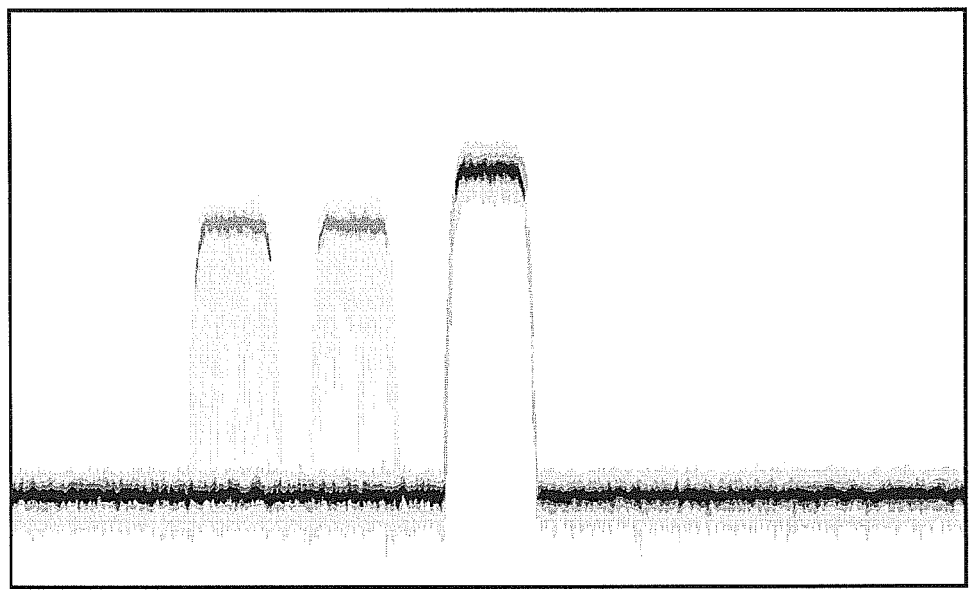
FIG. 4 shows a spectral presentation of the frequency of signal-level values of a first exemplary test signal or of the statistical parameter against frequencies of signal-level values of a test signal according to the method of the invention and the device of the invention.

In this manner, according to FIG. 4, the spectral distribution of a baseband signal is obtained in a constantly-activated main channel—presentation of the frequencies of the frequency-dependent signal levels of the test signal in relatively darker levels of grey—and the spectral distribution of a baseband signal in two subsidiary channels only activated in the short-term—presentation of the respective statistical parameters of the frequency-dependent signal levels of the test signal in relatively lighter levels of grey—which was determined on the basis of the method according to the invention and the device according to the invention for determining a statistical parameter for all frequencies of a frequency distribution of signal levels of a test signal registered in each case in several observation intervals.

Figure 5:
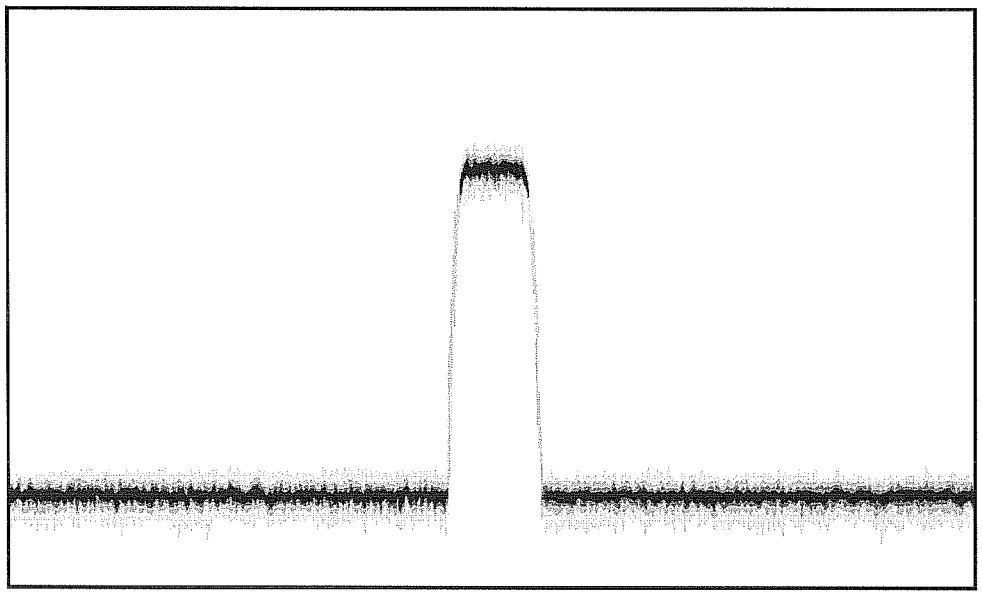
FIG. 5 shows a spectral presentation of the frequency of signal level values of a second exemplary test signal within the current observation interval.
Figure 6:
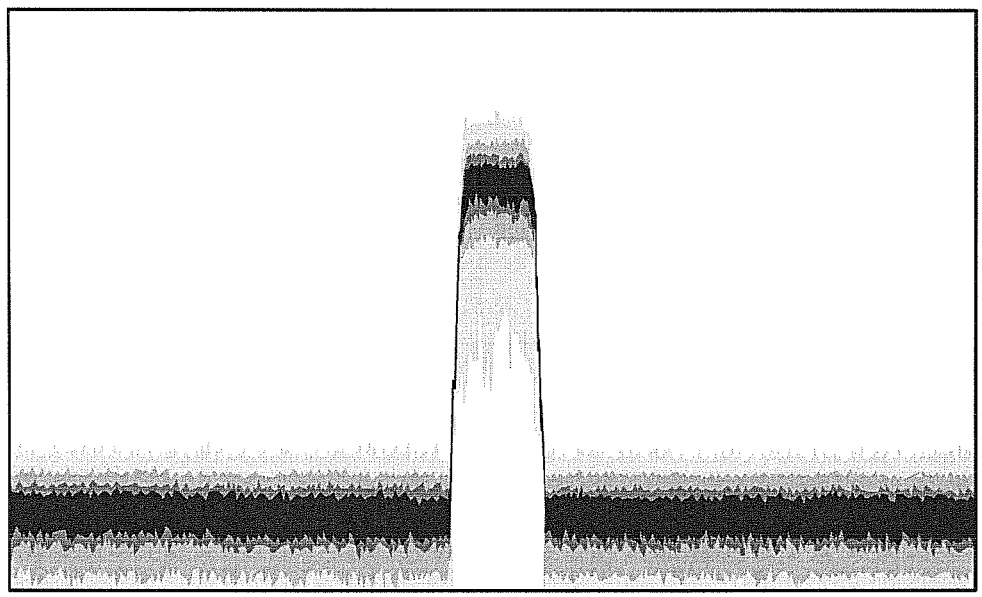
FIG. 6 shows a spectral presentation of the frequency of signal levels of a second exemplary test signal within the current observation interval.

In FIGS. 5 and 6, the spectral distribution of a further baseband signal is presented in each case in a previously-conventional presentation, wherein the frequencies of the spectral distribution presented in FIG. 5 are based upon an averaging over a total of one single observation interval, while the frequencies of the spectral distribution presented in FIG. 6 are averaged over a total of 100 observation intervals. On the basis of the averaging over a relatively large number of observation intervals, the spectral distribution in FIG. 6 provides a "relatively smoother characteristic" than the spectral distribution illustrated in FIG. 5.

Figure 7:
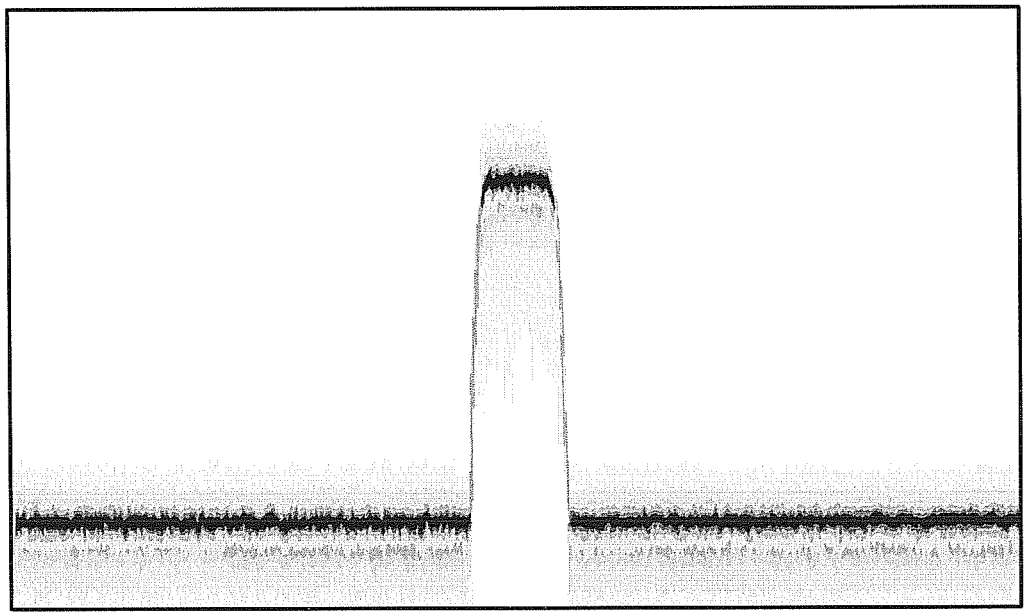
FIG. 7 shows a spectral presentation of the frequency of signal-level values of a second exemplary test signal or of the statistical parameter against frequencies of signal-level values of a test signal according to the method of the invention and the device of the invention.

In the spectral distribution of the same baseband signal of FIG. 7 determined according to the method of the invention and the device of the invention, the frequencies of the signal levels of the test signal, which are derived from an averaging over a total of one single observation interval and are accordingly determined from new in every observation interval, are buffered and presented in relatively-darker levels of grey, and the frequencies of the signal level of the signal levels of the test signal, which are derived from an averaging over a total of 100 observation intervals and are present as a frequency value and are buffered and accordingly enter the determination and presentation of the associated statistical parameter only in cycles of 100 observation intervals, are presented in relatively lighter levels of grey.

Figure 10:
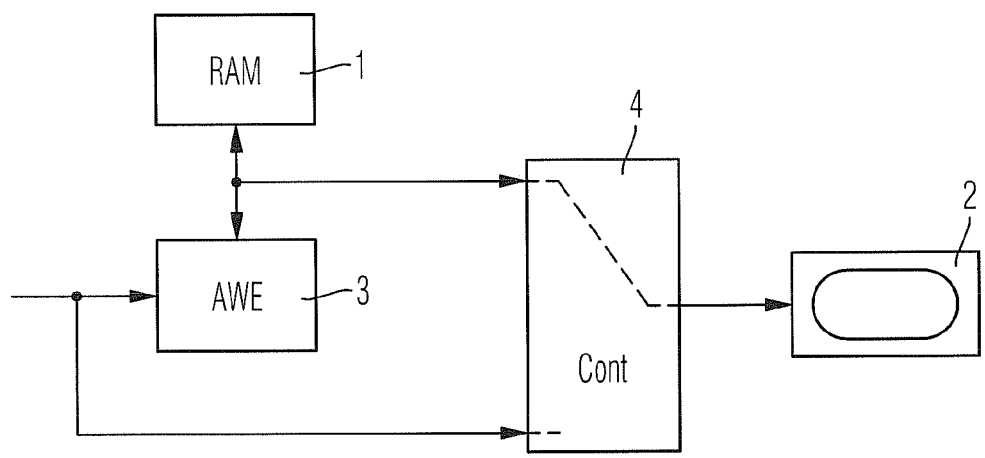
FIG. 10 shows a block circuit diagram of the device according to the invention for determining a statistical parameter for all frequencies of a frequency distribution of signal levels of a test signal registered respectively in several observation intervals.

The device according to the invention for determining a statistical parameter for all frequencies of a frequency distribution of signal levels of a test signal registered respectively in several observation intervals according to FIG. 10 has a memory unit 1, in which the frequency of signal levels of the test signal determined respectively in every signal-level range and at every value of the time or frequency raster of the frequency distribution and in every observation interval and respectively-calculated statistical measurement parameter over all previously-determined frequencies of signal levels of the test signal is stored.

An evaluation unit 3 disposed upstream of the memory unit 1 implements, on the one hand, the storage of the frequency values associated with the individual signal-level ranges and with the individual values of the time or frequency raster of the frequency distribution and, on the other hand, the calculation and storage of the statistical measurement parameter to be determined respectively for every signal-level range, for every value of the time or frequency raster of the frequency distribution and for every observation interval.

In the presence of a frequency value associated with a signal-level range and with a value of the time or frequency raster at the input of the evaluation unit 3, a superordinate procedural control unit 4 connects the respective frequency value through to the display device 2 for presentation on the display (display device), and, in the non-presence of a frequency value associated with a signal-level range and with a value of the time or frequency raster, the statistical parameter associated with the same signal-level range and with the same value of the time or frequency raster from the memory unit 1 through to the display device 2 for presentation on the display.

The invention is not restricted to the embodiment presented. In particular, other four-dimensional display types— for example, perspective, three-dimensional presentation with the addition of a color or grey scale presentation—and other parameters of the test signal moved into the "background" of the display presentation, for example, frequency-dependent signal-noise ratio, are covered by the invention.

The invention claimed is:

1. A method comprising:
measuring, in every observation interval of a plurality of observation intervals, a short-term frequency of occurrence of signal levels of a test signal registered in each case within a signal-level range and at a value of time and/or frequency raster of a frequency of occurrence distribution,
buffering, via at least one memory unit, the short-term frequency of occurrence distribution for display on a display device,
determining, via at least one processor, after every observation interval with a frequency of occurrence being different from zero, for every signal-level and every value of the time and/or frequency raster of the frequency of occurrence distribution, a long-term statistical measurement parameter from all short-term frequencies of occurrence measured and buffered in earlier observation intervals and being different from zero, and
displaying the long-term statistical parameter on the display device instead of the measured frequency of occurrence of signal levels within the signal-level range and at the value of the time and/or frequency raster, if no signal levels measured within the signal-level range and at the value of the time and/or frequency raster of the short-term frequency of occurrence distribution are counted within a current observation interval.

2. The method according to claim 1, wherein the statistical measurement parameter is the maximum, minimum or mean frequency of occurrence of signal levels of the test signal measured in each case within the signal-level range and at the value of the time and/or frequency raster of the frequency of occurrence distribution from frequencies of occurrences counted in all observation intervals of the signal levels of the test signal measured in each case within the signal-level range and at the value of the time and/or frequency raster of the frequency of occurrence distribution.

3. The method according to claim 1, wherein the statistical measurement parameter, buffered at the signal-level range and at the value of the time and/or frequency raster of the frequency of occurrence distribution, is displayed on the display device with a different brightness from the frequency of occurrence of measured signal levels counted within a current observation interval in the signal-level range and at the value of the time and/or frequency raster of the test signal.

4. The method according to claim 3, wherein the statistical measurement parameter, buffered at the signal-level range and the value of the time and/or frequency raster of the test signal, is displayed on the display device with a brighter brightness than the frequency of occurrence of measured signal levels counted in the current observation interval in the signal-level range and at the value of the time and/or frequency raster of the test signal.

5. A device comprising:
a memory unit for buffering a long-term statistical measurement parameter for every signal-level range in a plurality of signal-level ranges and every value of time and/or frequency raster of a short-term frequency of occurrence distribution being different from zero in each observation interval of a plurality of observation intervals;
an evaluation unit for updating the statistical measurement parameter buffered in the memory unit from long-term statistical measurement parameters buffered in the memory unit in earlier observation interval; and
a superordinate procedural control unit for outputting the long-term statistical measurement parameter, buffered in the memory unit for the signal-level range and for the value of the time and/or frequency raster of the frequency of occurrence distribution, instead of the short-term frequency of occurrence of signal levels of the test signal currently determined for the signal-level range and the value of the time and/or frequency raster, if no signal levels of the test signal for the signal-level range and the value of the time and/or frequency raster are currently measurable.

* * * * *

UNITED STATES PATENT AND TRADEMARK OFFICE
CERTIFICATE OF CORRECTION

| | | |
|---|---|---|
| PATENT NO. | : 8,630,818 B2 | Page 1 of 1 |
| APPLICATION NO. | : 12/516672 | |
| DATED | : January 14, 2014 | |
| INVENTOR(S) | : Kurt Schmidt | |

It is certified that error appears in the above-identified patent and that said Letters Patent is hereby corrected as shown below:

Title Page:

Item "(73) Assignee: Rohde & Schwarz GmgH & Co. KG, Munich (DE)"

Should read -- (73) Assignee: Rohde & Schwarz GmbH & Co. KG, Munich (DE) --

Signed and Sealed this
Fifteenth Day of April, 2014

Michelle K. Lee
*Deputy Director of the United States Patent and Trademark Office*